US012772559B2

(12) United States Patent
Komuro et al.

(10) Patent No.: US 12,772,559 B2
(45) Date of Patent: Oct. 20, 2026

(54) SEMICONDUCTOR INTEGRATED CIRCUIT DEVICE

(71) Applicant: Socionext Inc., Kanagawa (JP)

(72) Inventors: Hideyuki Komuro, Yokohama (JP); Toshio Hino, Yokohama (JP); Junji Iwahori, Yokohama (JP)

(73) Assignee: SOCIONEXT INC., Kanagawa (JP)

(*) Notice: Subject to any disclaimer, the term of this patent is extended or adjusted under 35 U.S.C. 154(b) by 320 days.

(21) Appl. No.: 18/738,947

(22) Filed: Jun. 10, 2024

(65) Prior Publication Data

US 2024/0332304 A1 Oct. 3, 2024

Related U.S. Application Data

(63) Continuation of application No. PCT/JP2022/044248, filed on Nov. 30, 2022.

(30) Foreign Application Priority Data

Dec. 17, 2021 (JP) ................................ 2021-205195

(51) Int. Cl.
*H10D 84/90* (2025.01)

(52) U.S. Cl.
CPC ......... *H10D 84/907* (2025.01); *H10D 84/981* (2025.01)

(58) Field of Classification Search
CPC .... H10D 84/907; H10D 84/981; H10D 84/01; H10D 84/0165; H10D 84/038; H10D 84/85; H10D 89/10; H10P 14/40; H10W 20/01; H10W 20/40; H10W 90/00
See application file for complete search history.

(56) References Cited

U.S. PATENT DOCUMENTS

| | | | |
|---|---|---|---|
| 10,170,413 | B2 | 1/2019 | Ohtou et al. |
| 10,872,818 | B2 | 12/2020 | Chiang et al. |
| 2018/0308826 | A1 | 10/2018 | Kawaminami |

(Continued)

FOREIGN PATENT DOCUMENTS

| | | | |
|---|---|---|---|
| JP | 2005-032839 | A | 2/2005 |
| JP | 2018-182213 | A | 11/2018 |

(Continued)

OTHER PUBLICATIONS

International Search Report dated Feb. 14, 2023 issued in International Patent Application No. PCT/JP2022/044248, with English translation.

*Primary Examiner* — Julia Slutsker
(74) *Attorney, Agent, or Firm* — Rimon P.C.

(57) ABSTRACT

First and second semiconductor chips are stacked one upon the other with the back face of the first semiconductor chip opposed to the principal face of the second semiconductor chip. The first semiconductor chip includes: first and second power lines formed in a buried interconnect layer, extending in the X direction, and adjoining each other in the Y direction; first and second contacts provided between the first and second power lines and the chip back face; and a third contact provided between a signal line and the chip back face. The third contact is located between the first and second power lines in the Y direction, and at a position different from the positions of the first and second contacts in the X direction, in planar view.

6 Claims, 10 Drawing Sheets

(56) References Cited

U.S. PATENT DOCUMENTS

| | | | | |
|---|---|---|---|---|
| 2021/0210466 | A1 * | 7/2021 | Okamoto | H10D 84/83 |
| 2021/0210468 | A1 | 7/2021 | Takeno et al. | |
| 2022/0231054 | A1 | 7/2022 | Okamoto et al. | |

FOREIGN PATENT DOCUMENTS

| | | | | |
|---|---|---|---|---|
| WO | 2020/065916 | A1 | 4/2020 | |
| WO | WO-2020066797 | A1 * | 4/2020 | H10W 72/00 |
| WO | 2021/070367 | A1 | 4/2021 | |

* cited by examiner

VDD
VSS
55
+A
115
125a
125b
CELL SCD

VDD
VSS
INV5
127b
117
127a
126b
116
126a
+C
+B
+A
+Y
57
56
CELL SCE
INV4

VDD
VSS
INV7
128b
118
128a
+B
+A
+Y
58
CELL SCF
INV6
BI
N-WELL
TSV
DIFFUSION LAYER (SOURCE/DRAIN/CHANNEL)
GATE INTERCONNECT
LI
CONTACT (BI-LI)
CONTACT (GATE-M1, LI-M1)
M1

SEMICONDUCTOR INTEGRATED CIRCUIT DEVICE

CROSS-REFERENCE TO RELATED APPLICATIONS

This is a continuation of International Application No. PCT/JP2022/044248 filed on Nov. 30, 2022, which claims priority to Japanese Patent Application No. 2021-205195 filed on Dec. 17, 2021. The entire disclosures of these applications are incorporated by reference herein.

BACKGROUND

The present disclosure relates to a semiconductor integrated circuit device having stacked semiconductor chips.

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through interconnects, thereby designing an LSI chip.

For higher integration of a semiconductor integrated circuit, it is proposed to use, for standard cells, interconnects laid in a buried interconnect layer, not interconnects laid in a metal interconnect layer formed above transistors as conventionally done.

U.S. Pat. No. 10,170,413 (FIG. 2C) discloses a technique of using interconnects laid in a buried interconnect layer not only as power lines (buried power rails (BPRs)) but also as signal lines. U.S. Pat. No. 10,872,818 discloses a technique of connecting buried power rails to a chip back face by way of through silicon vias (TSVs).

In the cited patent documents, however, no disclosure has been made on how to connect signal lines formed in a main chip to the chip back face.

An objective of the present disclosure is providing, in a semiconductor integrated circuit device having stacked semiconductor chips, an easily-manufacturable and reliable configuration of connecting signal lines formed in a main chip to the chip back face.

SUMMARY

According to the first mode of the present disclosure, a semiconductor integrated circuit device includes: a first semiconductor chip; and a second semiconductor chip stacked on the first semiconductor chip, wherein a back face of the first semiconductor chip and a principal face of the second semiconductor chip are opposed to each other, the first semiconductor chip includes a plurality of standard cells, a first power line laid in a buried interconnect layer, extending in a first direction and supplying a first power supply voltage to the plurality of standard cells, a second power line laid in the buried interconnect layer, extending in the first direction, placed adjacently to the first power line in a second direction perpendicular to the first direction, and supplying a second power supply voltage to the plurality of standard cells, a first contact provided between the first power line and the back face of the first semiconductor chip, a second contact provided between the second power line and the back face of the first semiconductor chip, and a third contact provided between a signal line connected to any of the plurality of standard cells and the back face of the first semiconductor chip, and the third contact is located between the first power line and the second power line in the second direction and at a position different from positions of the first and second contacts in the first direction, in planar view.

According to the above mode, the first and second semiconductor chips are stacked one upon the other with the back face of the first semiconductor chip opposed to the principal face of the second semiconductor chip. The first semiconductor chip includes the first and second power lines formed in the buried interconnect layer, extending in the first direction, and adjoining each other in the second direction. The first semiconductor chip also includes the first and second contacts provided between the first and second power lines and the chip back face, and the third contact provided between the signal line and the chip back face. The third contact is formed between the first and second power lines in the second direction, and at a position different from the positions of the first and second contacts in the first direction, in planar view. Therefore, the spacing between the third contact and the first and second contacts can be sufficiently secured, and thus even when the size of the third contact in planar view is made large, the manufacture can be easy and the reliability can be secured.

According to the second mode of the present disclosure, a semiconductor integrated circuit device includes: a first semiconductor chip; and a second semiconductor chip stacked on the first semiconductor chip, wherein a back face of the first semiconductor chip and a principal face of the second semiconductor chip are opposed to each other, the first semiconductor chip includes a plurality of standard cells, a first power line laid in a buried interconnect layer, extending in a first direction, and supplying a first power supply voltage to the plurality of standard cells, a second power line laid in the buried interconnect layer, extending in the first direction, placed adjacently to the first power line in a second direction perpendicular to the first direction, and supplying a second power supply voltage to the plurality of standard cells, a first contact provided between the first power line and the back face of the first semiconductor chip, a second contact provided between the second power line and the back face of the first semiconductor chip, and a third contact provided between a signal line connected to any of the plurality of standard cells and the back face of the first semiconductor chip, and the third contact has its center position located between a center position of the first contact and a center position of the second contact in the second direction, and is at a position different from positions of the first and second contacts in the first direction, in planar view.

According to the above mode, the first and second semiconductor chips are stacked one upon the other with the back face of the first semiconductor chip opposed to the principal face of the second semiconductor chip. The first semiconductor chip includes the first and second power lines formed in the buried interconnect layer, extending in the first direction, and adjoining each other in the second direction. The first semiconductor chip also includes the first and second contacts provided between the first and second power lines and the chip back face, and the third contact provided between the signal line and the chip back face. The third contact has a center position located between the center position of the first contact and the center position of the second contact in the second direction, and is at a position different from the positions of the first and second contacts in the first direction, in planar view. Therefore, the spacing between the third contact and the first and second contacts can be sufficiently secured, and thus even when the size of the third contact in planar view is made large, the manufacture can be easy and the reliability can be secured.

According to the present disclosure, in a semiconductor integrated circuit device having stacked semiconductor chips, it is possible to implement an easily-manufacturable and reliable configuration of connecting signal lines formed in a main chip to the chip back face.

BRIEF DESCRIPTION OF THE DRAWINGS

FIGS. 10A-10B show a configuration of a cell having a TSV for signal according to an alteration, in which FIG. 10A is a plan view and FIG. 10B is a cross-sectional view.

DETAILED DESCRIPTION

An embodiment of the present disclosure will be described hereinafter with reference to the accompanying drawings. Note that, in the following description, in the plan views such as FIG. 2, the horizontal direction in the figure is called an X direction (corresponding to the first direction), the vertical direction in the figure is called a Y direction (corresponding to the second direction), and the direction perpendicular to the substrate plane is called a Z direction (corresponding to the depth direction). Also, "VDD" indicates a power supply voltage, a high-voltage side power supply itself, or a high-voltage side power line, and "VSS" indicates a power supply voltage, a low-voltage side power supply itself, or a low-voltage side power line. Note also that standard cells are herein simply referred to as "cells" as appropriate.

Embodiment

Figure 1:
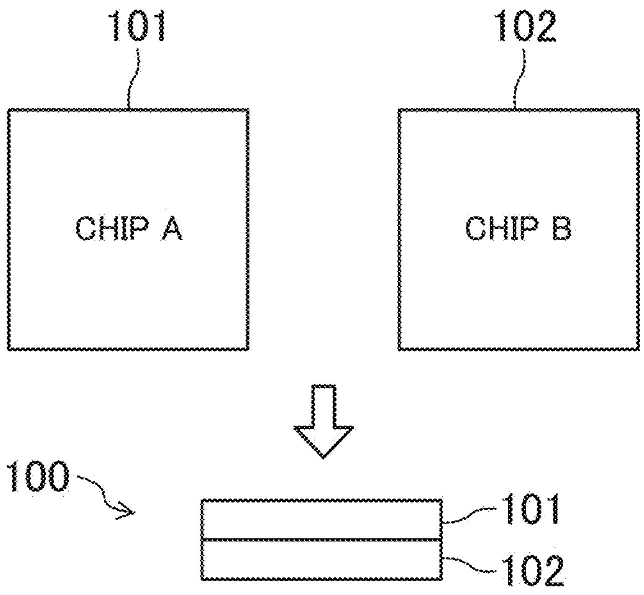
FIG. 1 shows an entire configuration of a semiconductor integrated circuit device according to an embodiment.

FIG. 1 is a view showing the entire configuration of a semiconductor integrated circuit device according to an embodiment. As shown in FIG. 1, a semiconductor integrated circuit device 100 is constituted by a first semiconductor chip 101 (chip A, main chip) and a second semiconductor chip 102 (chip B, back chip) stacked one upon the other. In the first semiconductor chip 101, a circuit including a plurality of transistors is formed. In the second semiconductor chip 102, no elements such as transistors are formed, but power lines are formed in a plurality of interconnect layers. In the stack, the back face of the first semiconductor chip 101 and the principal face of the second semiconductor chip 102 are opposed to each other.

Figure 2:
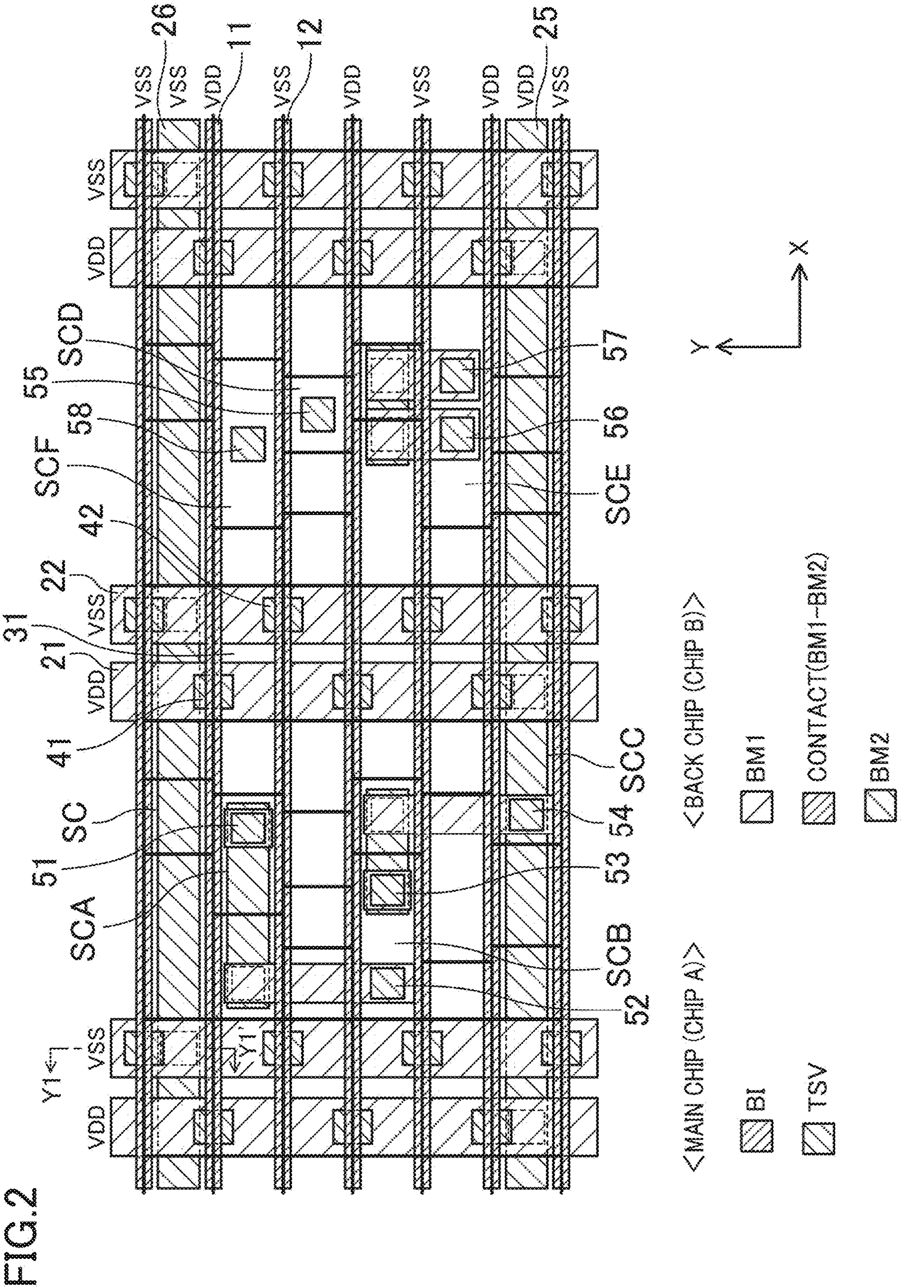
FIG. 2 shows a block layout example of the semiconductor integrated circuit device of FIG. 1.
Figure 3:
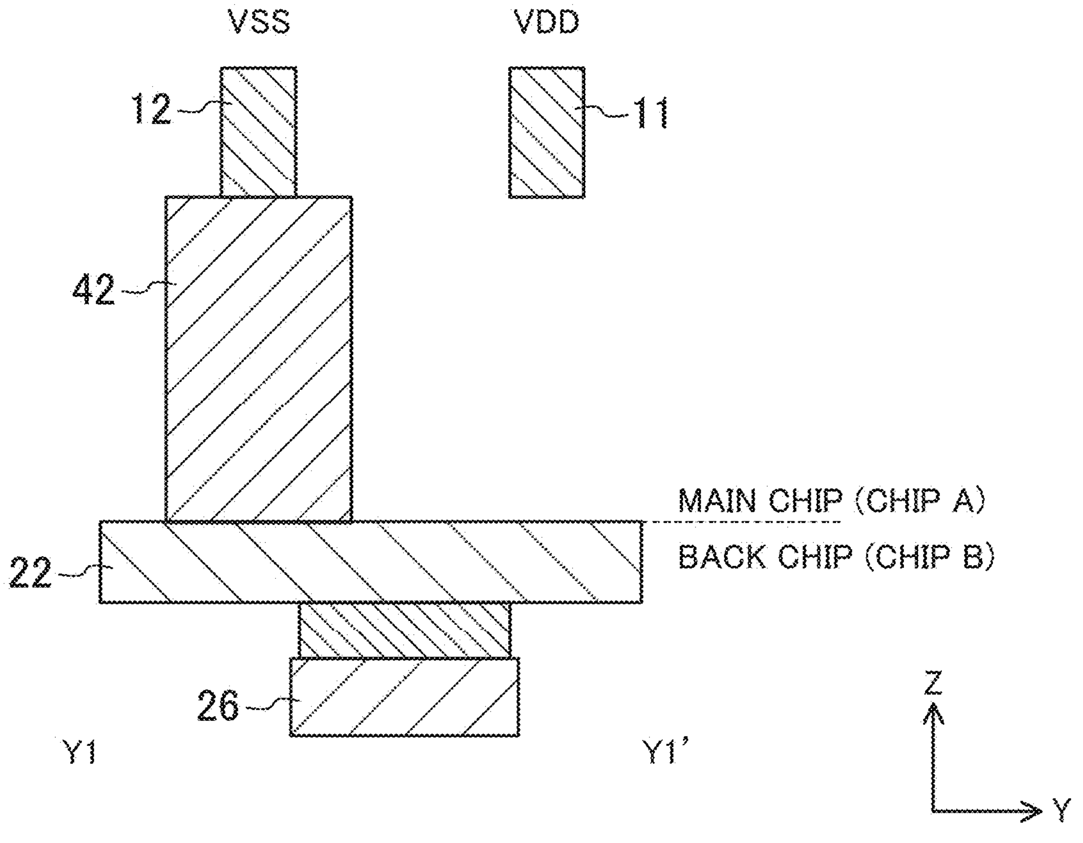
FIG. 3 is a cross-sectional view of a structure in FIG. 2.

FIG. 2 is a plan view showing a block layout example of the semiconductor integrated circuit device of FIG. 1, and FIG. 3 is a cross-sectional view showing a cross-sectional structure taken along line Y1-Y1' in FIG. 2. In the block layout of FIG. 2, a plurality of standard cells SC are arranged in the X and Y directions in the first semiconductor chip 101. Note that, in FIG. 2, only power lines formed in a buried interconnect layer (BI) and contacts (TSVs) are illustrated in the first semiconductor chip 101, and only interconnects formed in a first metal interconnect layer (BM1), interconnects formed in a second metal interconnect layer (BM2), and contacts between them are illustrated in the second semiconductor chip 102.

In the first semiconductor chip 101, buried power lines 11 supplying VDD to the standard cells SC and buried power lines 12 supplying VSS to the standard cells SC extend in the X direction. The buried power lines 11 and the buried power lines 12 are arranged alternately in the Y direction, and the standard cells SC are each placed between the buried power line 11 and the buried power line 12, receiving VDD from the buried power line 11 and VSS from the buried power line 12.

In the second semiconductor chip 102, power lines 21 supplying VDD and power lines 22 supplying VSS extend in the Y direction in the first metal interconnect layer. The power lines 21 and 22 are each paired, arranged side by side with a predetermined spacing between them in the X direction. A power line 25 supplying VDD and a power line 26 supplying VSS extend in the X direction in the second metal interconnect layer. The power lines 21 are connected to the power line 25 through contacts, and the power lines 22 are connected to the power line 26 through contacts.

In the first semiconductor chip 101, power cells 31 are formed at positions overlapping the power lines 21 and 22 of the second semiconductor chip 102 in planar view. The power cells 31 are arranged in line in the Y direction, and each have a TSV 41 for VDD and a TSV 42 for VSS. The buried power lines 11 of the first semiconductor chip 101 and the power lines 21 of the second semiconductor chip 102 are connected through the TSVs 41. The buried power lines 12 of the first semiconductor chip 101 and the power lines 22 of the second semiconductor chip 102 are connected through the TSVs 42. The configuration of the power cells 31 will be described in detail later.

As is found from the cross-sectional view of FIG. 3, since the TSV (TSV 42 for VSS in FIG. 3) formed in the first semiconductor chip 101 is a via extending from the buried power line (buried power line 12 for VSS in FIG. 3) in the principal face portion of the first semiconductor chip 101 down to the back face thereof, its size in the Z direction (depth) is large. Similarly, the size of the TSV 41 for VDD in the Z direction is large. Therefore, in order to manufacture the TSVs with high reliability while sufficiently reducing the resistance value of the TSVs, it is necessary to increase the size of the TSVs in planar view. In other words, by increasing the plane size of the TSVs, a power supply voltage drop can be curbed.

In the block layout of FIG. 2, the TSVs 41 overlap the power lines 21 in planar view and are arranged in line the Y direction. The TSVs 42 overlap the power lines 22 in planar view and are arranged in line the Y direction. That is, the TSVs 41 for VDD and the TSVs 42 for VSS are placed at different positions from each other in the X direction. Therefore, the power lines 21 and 22 of the second semiconductor chip 102 can be laid linearly. In addition, since a sufficiently wide spacing can be secured between the TSVs 41 for VDD and the TSVs 42 for VSS, TSVs large in plane size can be manufactured easily and the reliability can be secured.

Also, in the block layout of FIG. 2, the standard cells SC include standard cells SCA, SCB, SCC, SCD, SCE, and SCF each having a TSV for signal in the first semiconductor chip 101. The cell SCA has a TSV 51 for signal, the cell SCB has TSVs 52 and 53 for signal, the cell SCC has a TSV 54 for signal, the cell SCD has a TSV 55 for signal, the cell SCE has TSVs 56 and 57 for signal, and the cell SCF has a TSV 58 for signal.

In the cell SCA, which has the TSV 51 for an output signal, a signal is output to the second semiconductor chip 102 through the TSV 51. In the cell SCB, which has the TSV 52 for an input signal and the TSV 53 for an output signal, a signal is input from the second semiconductor chip 102 through the TSV 52, and a signal is output to the second semiconductor chip 102 through the TSV 53. In the cell SCC, which has the TSV 54 for an input signal, a signal is input from the second semiconductor chip 102 through the TSV 54. The TSV 51 of the cell SCA is connected to the TSV 52 of the cell SCB through interconnects and contacts in the second semiconductor chip 102. The TSV 53 of the cell SCB is connected to the TSV 54 of the cell SCC through interconnects and contacts in the second semiconductor chip 102.

In the cell SCD, the TSV 55 is provided for signal transmission between the first semiconductor chip 101 and the second semiconductor chip 102. In the cell SCE, the TSV 56 is provided for output of an intermediate signal to the second semiconductor chip 102, and the TSV 57 is provided for input of the intermediate signal from the second semiconductor chip 102. The TSVs 56 and 57 are mutually connected through interconnects and contacts in the second semiconductor chip 102. In the cell SCF, the TSV 58 is provided for an intermediate node signal.

Details of the configurations of the standard cells SCA, SCB, SCC, SCD, SCE, and SCF will be described later.

Note that, in the block layout of FIG. 2, the TSVs 51 to 58 for signal are placed at positions different from the positions of the TSVs 41 and 42 for power in the X direction. The reason for this is to sufficiently secure the distances between the TSVs, thereby easing the manufacture and also securing the reliability.

Also, the TSVs 51 to 58 for signal are placed between the buried power lines 11 and 12 in the Y direction, and the center positions of the TSVs 51 to 58 are different from the center positions of the TSVs 41 and 42 for power in the Y direction. This can avoid the TSVs for signal from becoming shorted with the buried power lines. This can also avoid a possibility that the buried power lines may be cut off due to the presence of the TSVs for signal thereby weakening the power supply wiring network.

Figures 4A, 4B, 4C:
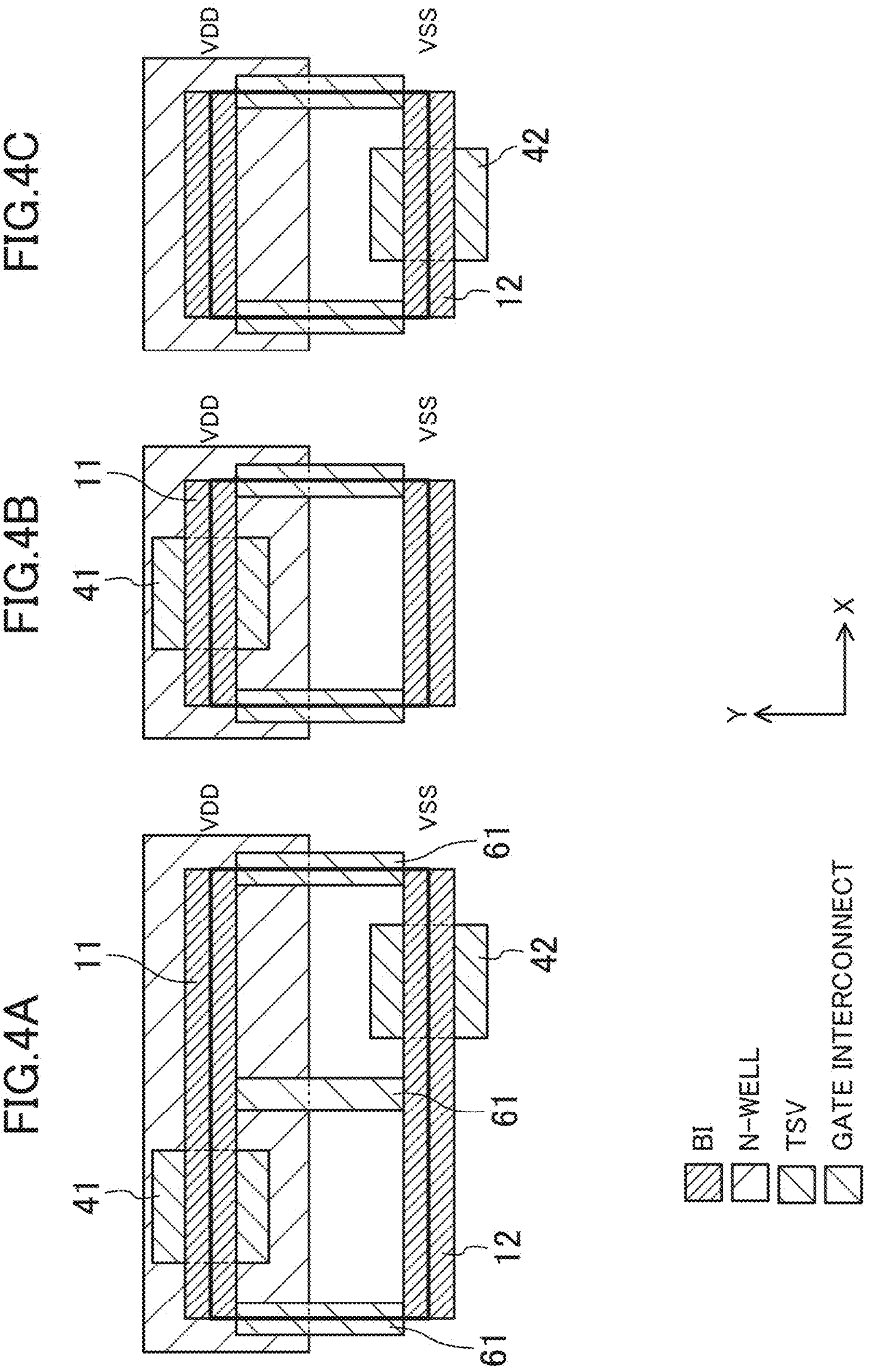
FIGS. 4A-4C show layout examples of power cells.

FIGS. 4A-4C are plan views showing layout examples of power cells. FIG. 4A shows a layout of the power cell 31 shown in FIG. 2. As shown in FIG. 4A, the power cell 31 includes the buried power line 11 supplying VDD, the buried power line 12 supplying VSS, and the TSVs 41 and 42. The TSV 41 is connected to the buried power line 11, and the TSV 42 is connected to the buried power line 12. In FIG. 4A, the power cell 31 includes dummy gates 61. Note that the power cell 31 may include a dummy transistor.

FIG. 4B is a power cell for VDD, and FIG. 4C is a power cell for VSS. The power cell shown in FIG. 4B includes only the TSV 41 for VDD, connected to the buried power line 11. The power cell shown in FIG. 4C includes only the TSV 42 for VSS, connected to the buried power line 12. By placing the power cell of FIG. 4B and the power cell of FIG. 4C next to each other in the X direction, the same layout as the power cell of FIG. 4A is formed. Note however that the power cell of FIG. 4B and the power cell of FIG. 4C are not necessarily required to be placed next to each other, but may be placed apart from each other. Also, the power cell of FIG. 4A and the power cells of FIGS. 4B and 4C may be placed in a mixed manner in a block layout.

If the size of TSVs can be made small, TSVs may be placed in normal standard cells to correspond to the buried power lines as appropriate. Since this eliminates the necessity of providing exclusive power cells, reduction in the area of the semiconductor integrated circuit device can be achieved. In this case, TSVs may just be arranged so that TSVs for VDD be lined in the Y direction and TSVs for VSS be lined in the Y direction, as in the block layout of FIG. 2. Note that the power cells and normal cells having a TSV for power may be placed in a mixed manner.

Figure 5:
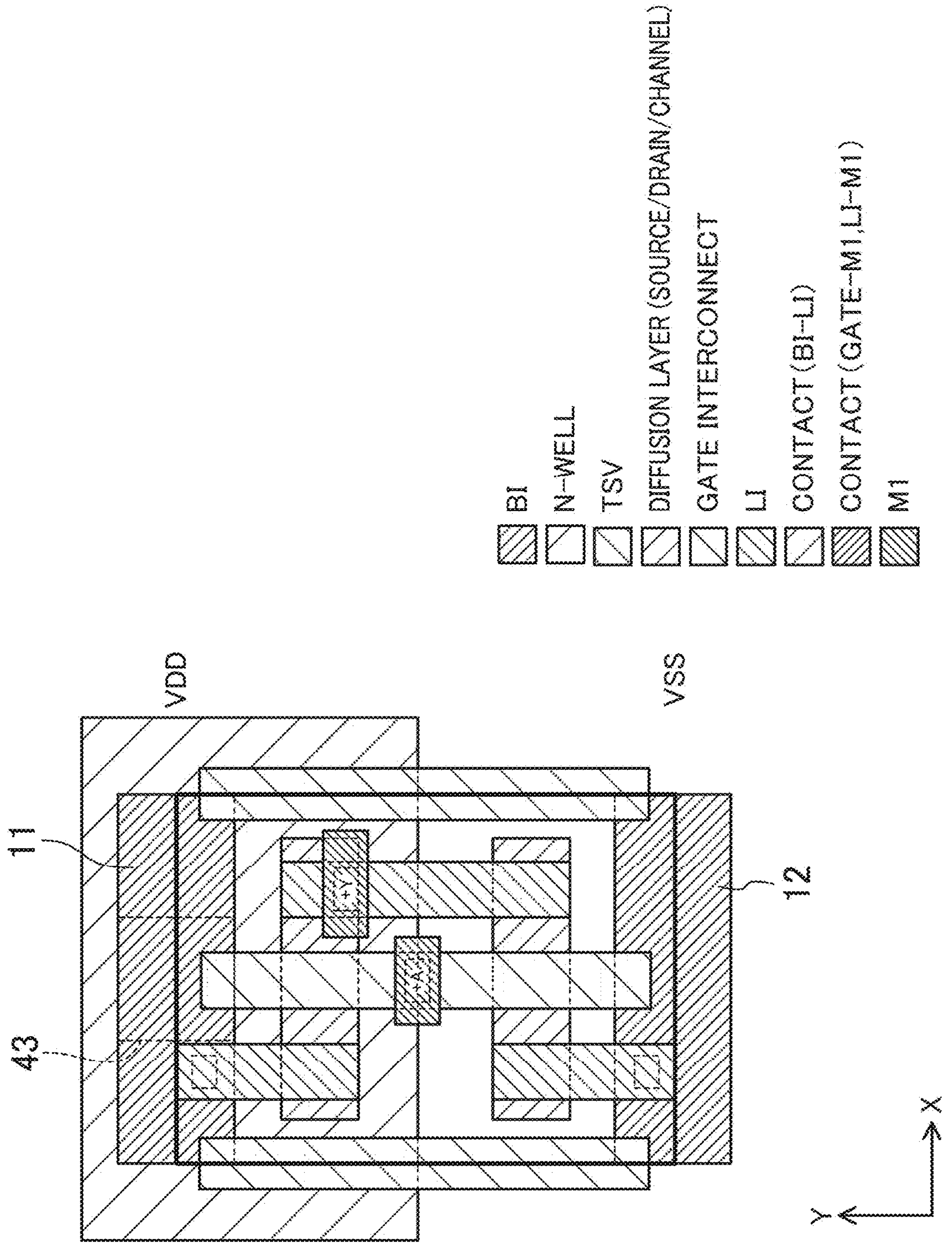
FIG. 5 shows a layout example of a normal cell having a TSV for power.

FIG. 5 shows a layout example of a normal standard cell having a TSV for a buried power line. The cell of FIG. 5 implements an inverter shown in FIG. 6. In the example of FIG. 5, a TSV 43 is provided for the buried power line 11 supplying VDD. The position of the TSV 43 is not limited to that shown in FIG. 5, but may be on a cell boundary in the X direction, for example. While the TSV 43 for VDD is placed in the example of FIG. 5, a TSV may be provided for the buried power line 12 supplying VSS. That is, both a TSV for VDD and a TSV for VSS may be placed, or either one of them may be placed, in one cell.

Figures 7A, 7B, 7C:
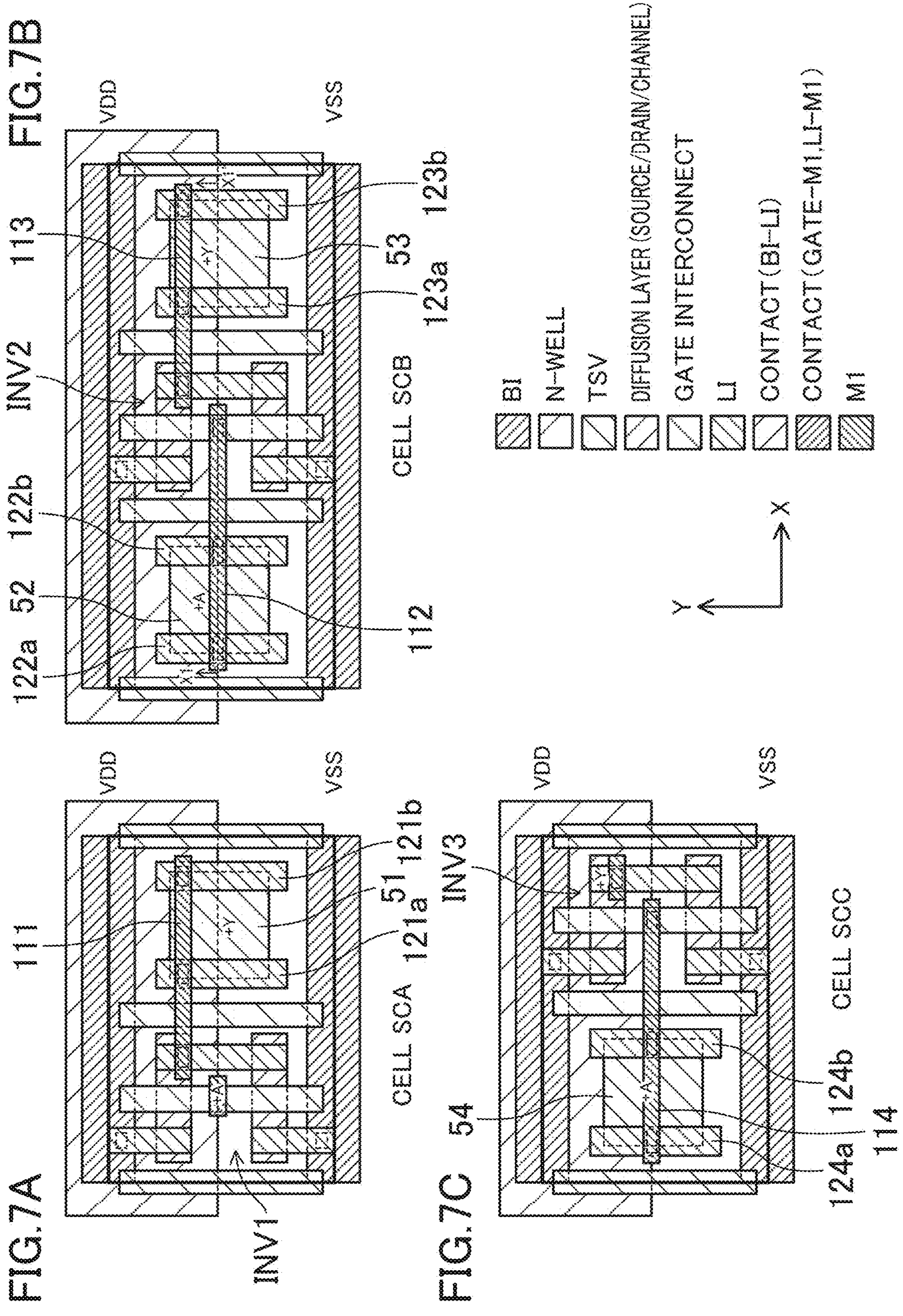
FIGS. 7A-7C are layout examples of cells having a TSV for signal.
Figures 8A, 8B, 8C:
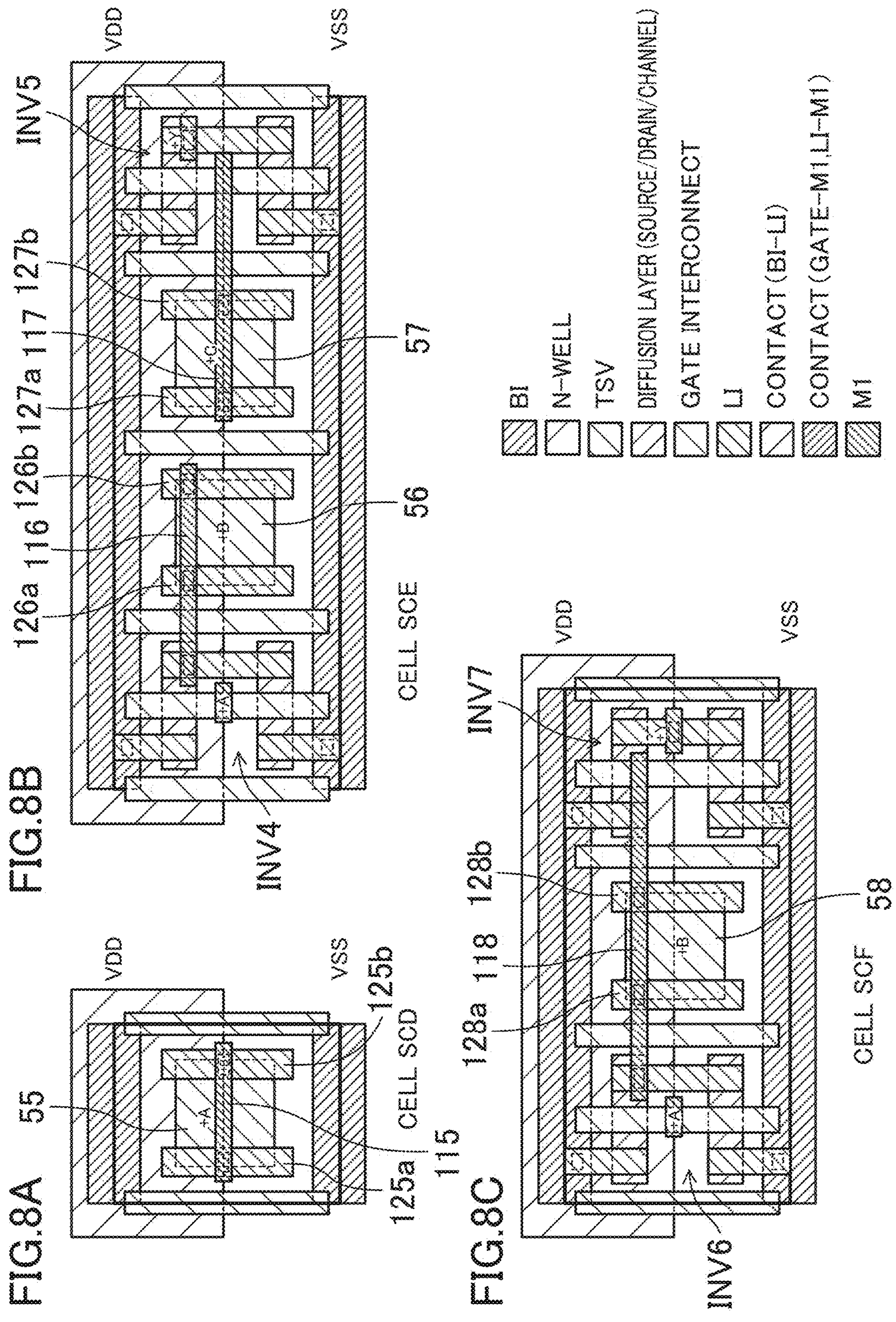
FIGS. 8A-8C are layout examples of cells having a TSV for signal.
Figure 9:
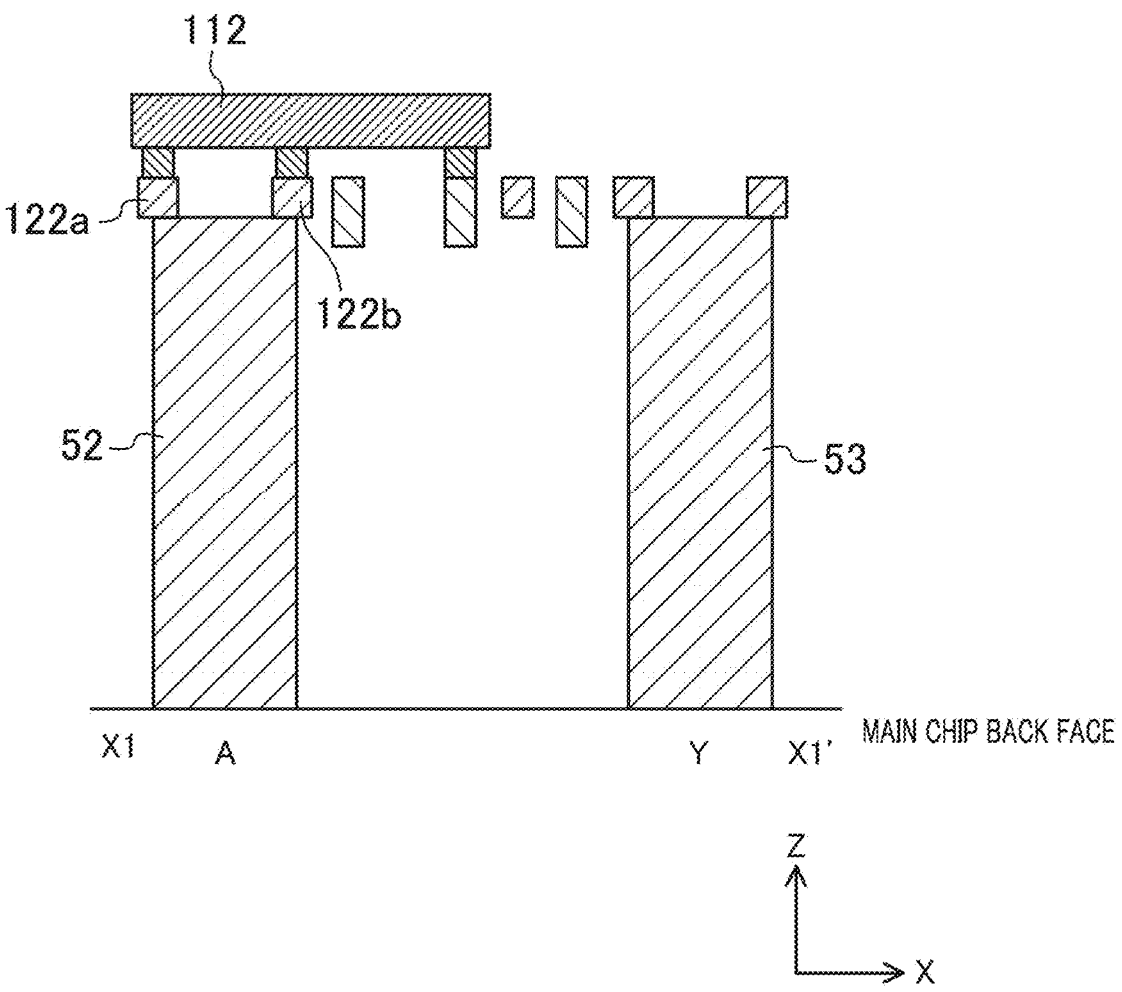
FIG. 9 is a cross-sectional view of a structure in FIG. 7B.

FIGS. 7A-7C and FIGS. 8A-8C show layout examples of cells having a TSV for signal. FIGS. 7A, 7B, and 7C show layouts of the standard cells SCA, SCB, and SCC, respectively, in the block layout of FIG. 2. FIGS. 8A, 8B, and 8C show layouts of the standard cells SCD, SCE, and SCF, respectively, in the block layout of FIG. 2. FIG. 9 is a cross-sectional view showing a cross-sectional structure of the standard cell SCB taken along line X1-X1' in FIG. 7B.

Figure 6:
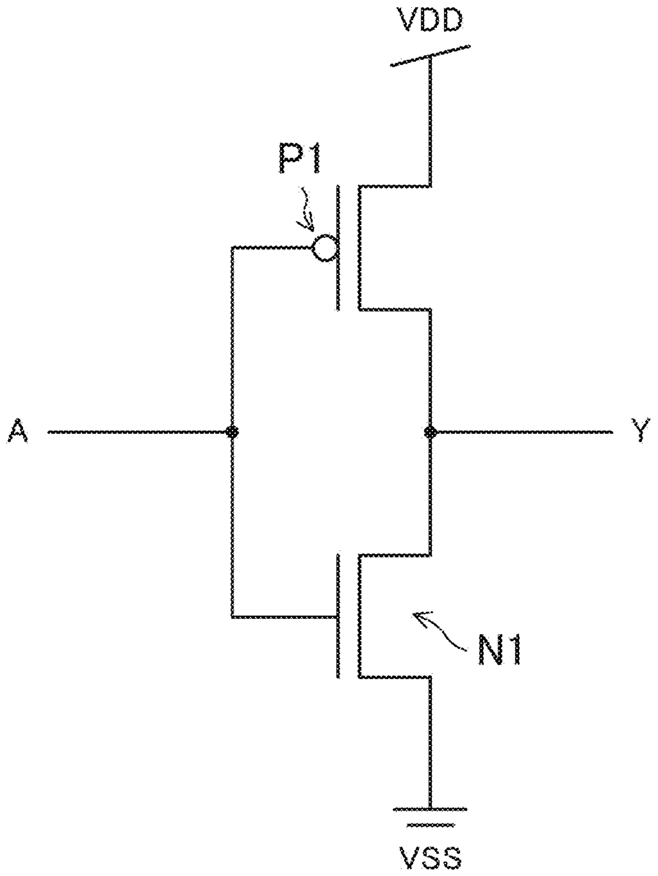
FIG. 6 shows a circuit configuration of an inverter.

The cells SCA, SCB, and SCC shown in FIGS. 7A to 7C each constitute the inverter shown in FIG. 6. Note that the cell having a TSV for signal may constitute a logic other than an inverter.

As shown in FIG. 7A, the cell SCA includes an inverter INV1 and the TSV 51 connected to an output Y of the inverter INV1. The TSV 51 is connected to an M1 interconnect 111, which is connected to the output Y of the inverter INV1, through local interconnects 121*a* and 121*b*. The TSV 51 has an overlap with transistors constituting the inverter INV1 in the Y direction.

As shown in FIG. 7B, the cell SCB includes an inverter INV2, the TSV 52 connected to an input A of the inverter INV2, and the TSV 53 connected to an output Y of the inverter INV2. The TSV 52 is connected to an M1 interconnect 112, which is connected to the input A of the inverter INV2, through local interconnects 122*a* and 122*b*. The TSV 53 is connected to an M1 interconnect 113, which is connected to the output Y of the inverter INV2, through local interconnects 123*a* and 123*b*. The TSVs 52 and 53 each have an overlap with transistors constituting the inverter INV2 in the Y direction.

As shown in FIG. 7C, the cell SCC includes an inverter INV3 and the TSV 54 connected to an input A of the inverter INV3. The TSV 54 is connected to an M1 interconnect 114, which is connected to the input A of the inverter INV3, through local interconnects 124*a* and 124*b*. The TSV 54 has an overlap with transistors constituting the inverter INV3 in the Y direction.

The cell SCD shown in FIG. 8A does not include any circuit but only includes the TSV 55 for signal. The TSV 55, connected to a signal terminal A, is connected to an M1 interconnect 115, which is to be a signal terminal B, through local interconnects 125*a* and 125*b*. The M1 interconnect 115 may be connected to an input or output terminal of another cell, whereby this terminal can be connected to the second semiconductor chip 102 through the TSV 55.

The cells SCE and SCF shown in FIGS. 8B and 8C each constitute a buffer cell including two-stage inverters. The cell SCE includes the TSV 56 for an intermediate output and the TSV 57 for an intermediate input. The cell SCF includes the TSV 58 for an intermediate node.

Specifically, as shown in FIG. 8B, the cell SCE includes an inverter INV4, an inverter INV5, the TSV 56 connected to an output of the inverter INV4, and the TSV 57 connected to an input of the inverter INV5. The TSV 56 is connected to an M1 interconnect 116, which is connected to the output of the inverter INV4, through local interconnects 126*a* and 126*b*. The TSV 57 is connected to an M1 interconnect 117, which is connected to the input of the inverter INV5, through local interconnects 127*a* and 127*b*. The TSVs 56 and 57 each have an overlap with transistors constituting the inverters INV4 and INV5 in the Y direction.

In the cell SCE shown in FIG. 8B, the output of the former-stage inverter INV4 is output to the second semiconductor chip 102 through the TSV 56 as an intermediate output B. The output is received back through the TSV 57 as an intermediate input C to be given to the input of the latter-stage inverter INV5. A signal line connecting the TSV 56 and the TSV 57 is provided in the second semiconductor chip 102. By changing the length of the signal line, the signal delay in the cell SCE can be adjusted.

As shown in FIG. 8C, the cell SCF includes an inverter INV6, an inverter INV7, and the TSV 58 connected to the output of the inverter INV6 and the input of the inverter INV7. The TSV 58 is connected to an M1 interconnect 118, which is connected to the output of the inverter INV6 and the input of the inverter INV7, through local interconnects 128*a* and 128*b*. The TSV 58 has an overlap with transistors constituting the inverters INV6 and INV7 in the Y direction.

In the cell SCF shown in FIG. 8C, the intermediate node of the inverters INV6 and INV7, as a signal terminal B, is connected to the second semiconductor chip 102 through the TSV 58. In the second semiconductor chip 102, an interconnect connected to the TSV 58 is provided. Since this interconnect works as a capacitance, the delay in the cell SCF can be adjusted by adjusting the length or the like of the interconnect.

Note that the cell SCD shown in FIG. 8A and a cell including no TSV for signal may be combined to implement a configuration similar to that of a cell having a TSV for signal.

As is found from the cross-sectional view of FIG. 9, the TSV for signal (TSV 52 in FIG. 9) formed in the first semiconductor chip 101 is connected to the local interconnects (local interconnects 122*a* and 122*b* in FIG. 9). Therefore, the TSVs for signal are large in size in the Z direction (depth) compared with the TSVs for power, causing increase in resistance value. For this reason, the TSVs for signal are preferably made larger in size in planar view than the TSVs for power. Also, the planar shape of the TSVs for signal is not necessarily required to be a square, but may be a rectangle or the like.

The standard cells having a TSV for signal described in this embodiment can be used as cells for clock signal propagation, for example. As an example, thick lines may be provided as lines for clock signal in the second semiconductor chip 102 in addition to the power lines, and the TSVs for signal in the first semiconductor chip 101 may be connected to such lines for clock signal. Therefore, since a clock signal can be transmitted through low-resistance lines, low-delay and low-skew distribution of the clock can be achieved.

As described above, according to this embodiment, the first semiconductor chip 101 and the second semiconductor chip 102 are stacked one upon the other with the back face of the first semiconductor chip 101 opposed to the principal face of the second semiconductor chip 102. The first semiconductor chip 101 includes the buried power lines 11 and 12 extending in the X direction and adjoining each other in the Y direction. The first semiconductor chip 101 also includes the TSVs 41 and 42 for power provided between the power lines 11 and 12 and the chip back face and the TSVs 51 to 58 for signal provided between the signal lines and the chip back face. The TSVs 51 to 58 for signal are located between the power lines 11 and 12 in the Y direction, and at positions different from the positions of the TSVs 41 and 42 for power in the X direction, in planar view. Also, the TSVs 51 to 58 for signal have their center positions located between the center positions of the TSVs 41 and 42 for power in the Y direction, and are at positions different from the positions of the TSVs 41 and 42 for power in the X direction, in planar view. Therefore, the spacing between the TSVs 51 to 58 for signal and the TSVs 41 and 42 for power can be sufficiently secured, and thus even when the size of the TSVs 51 to 58 for signal in planar view is made large, the manufacture can be easy and the reliability can be secured.

Alteration

In the embodiment described above, the TSVs for signal are connected to the local interconnects formed above. Instead, the TSVs for signal may be connected to buried interconnects formed above.

Figure 10B:
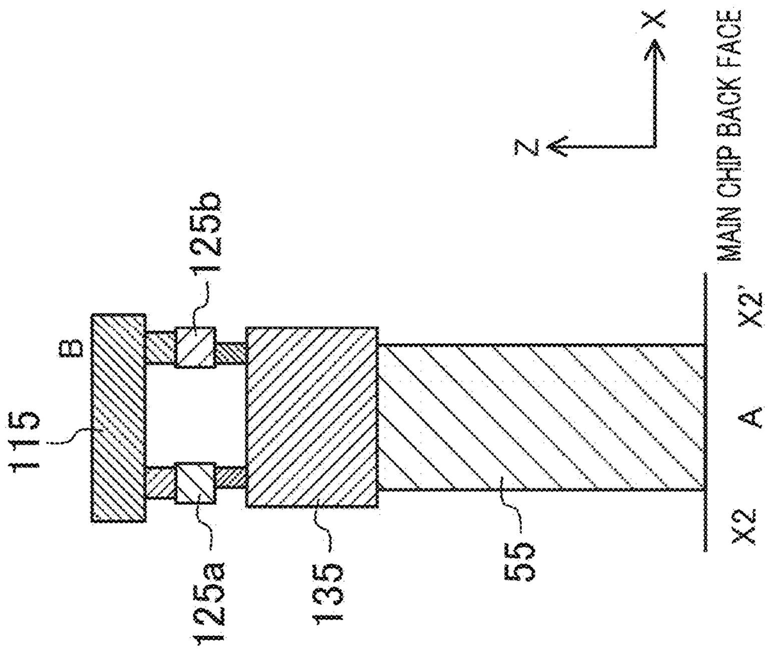
Figure 10A:
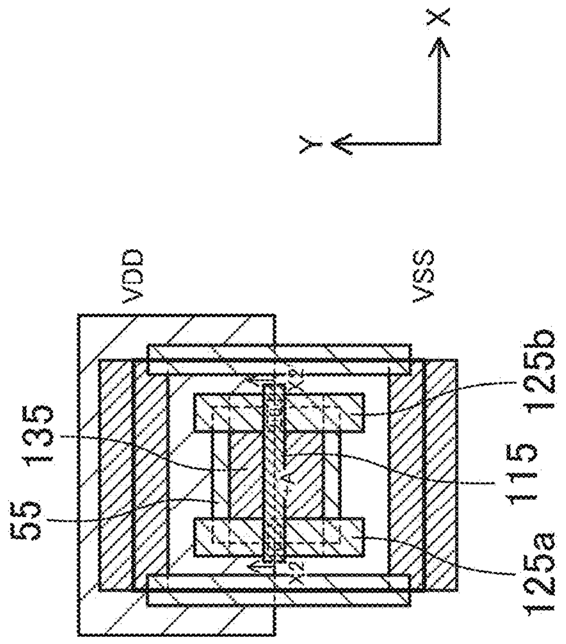

FIGS. 10A-10B are views showing a configuration of a cell having a TSV for signal according to an alteration, in which FIG. 10A is a plan view showing a layout of the cell, and FIG. 10B is a cross-sectional view showing a cross-sectional structure taken along line X2-X2' in FIG. 10A. The cell shown in FIGS. 10A-10B corresponds to the standard cell SCD described above.

In the cell shown in FIGS. 10A-10B, a buried interconnect 135 is formed above the TSV 55 for signal, and the TSV 55 for signal is connected to an M1 interconnect 115, which is to be an input B, through the buried interconnect 135, contacts, local interconnects 125*a* and 125*b*, and contacts. Note that the structure of this alteration can also be applied to other cells having a TSV for signal.

According to the present disclosure, in a semiconductor integrated circuit device having stacked semiconductor chips, it is possible to implement an easily-manufacturable and reliable configuration of connecting signal lines formed in a main chip to the chip back face. The present disclosure is therefore useful for cost reduction of LSI.

The invention claimed is:

1. A semiconductor integrated circuit device, comprising:
a first semiconductor chip; and
a second semiconductor chip stacked on the first semiconductor chip, wherein
a back face of the first semiconductor chip and a principal face of the second semiconductor chip are opposed to each other,
the first semiconductor chip includes
a plurality of standard cells,
a first power line laid in a buried interconnect layer, extending in a first direction and supplying a first power supply voltage to the plurality of standard cells, a second power line laid in the buried interconnect layer, extending in the first direction, placed adjacently to the first power line in a second direction perpendicular to the first direction, and supplying a second power supply voltage to the plurality of standard cells, a first contact provided between the first power line and the back face of the first semiconductor chip, a second contact provided between the second power line and the back face of the first semiconductor chip, and a third contact provided between a signal line connected to any of the plurality of standard cells and the back face of the first semiconductor chip, and the third contact is located between the first power line and the second power line in the second direction and at a position different from positions of the first and second contacts in the first direction, in planar view.

2. The semiconductor integrated circuit device of claim 1, wherein the second semiconductor chip includes a first signal line laid in a first interconnect layer that is an interconnect layer closest to the principal face, and the third contact is connected to the first signal line.

3. The semiconductor integrated circuit device of claim 1, wherein the plurality of standard cells include a first standard cell having the third contact and a first transistor constituting a logic.

4. The semiconductor integrated circuit device of claim 3, wherein the third contact has an overlap with the first transistor in the second direction in planar view.

5. The semiconductor integrated circuit device of claim 3, wherein the first standard cell is a cell for clock signal propagation.

6. The semiconductor integrated circuit device of claim 1, wherein the third contact is larger in size than the first and second contacts in planar view.

* * * * *